United States Patent [19]
Lin

[11] Patent Number: 6,083,798
[45] Date of Patent: Jul. 4, 2000

[54] METHOD OF PRODUCING A METAL OXIDE SEMICONDUCTOR DEVICE WITH RAISED SOURCE/DRAIN

[75] Inventor: Ming-Ren Lin, Cupertino, Calif.

[73] Assignee: Advanced Micro Devices, Inc., Sunnyvale, Calif.

[21] Appl. No.: 09/084,322

[22] Filed: May 26, 1998

[51] Int. Cl.[7] .................................................. H01L 21/336
[52] U.S. Cl. ..................... 438/297; 438/300; 438/301; 438/303; 438/564; 438/626; 438/692
[58] Field of Search .................................. 438/300, 297, 438/303, 301

[56] References Cited

U.S. PATENT DOCUMENTS

| | | | |
|---|---|---|---|
| 4,998,150 | 3/1991 | Rodder et al. | 357/23.1 |
| 5,336,903 | 8/1994 | Ozturk et al. | |
| 5,381,028 | 1/1995 | Iwasa | 257/316 |
| 5,496,750 | 3/1996 | Moslehi | |
| 5,691,212 | 11/1997 | Tsai et al. | |
| 5,879,997 | 3/1999 | Lee et al. | |
| 5,885,761 | 3/1999 | Duane et al. | |
| 5,949,105 | 9/1999 | Moslehi | |

*Primary Examiner*—John F. Niebling
*Assistant Examiner*—Jonathan Hack

[57] ABSTRACT

A semiconductor device and a method of making the device with a raised source/drain has a semiconductive material that is non-selectively deposited in a layer over the device area. The semiconductive material is then etched to form spacers that will form the raised soure/drain areas following doping of the spacers. The gate of the semiconductor device is protected during the etching by an etch stop layer that is grown or deposited over the structure to be protected, e.g., the gate, prior to the deposition of the semiconductive material layer. Lightly doped drain ion implantation is performed prior to the formation of the spacers, and source-drain ion implantation is performed preferably after the formation of the spacers, to create the shallow junctions.

17 Claims, 3 Drawing Sheets

METHOD OF PRODUCING A METAL OXIDE SEMICONDUCTOR DEVICE WITH RAISED SOURCE/DRAIN

FIELD OF THE INVENTION

The present invention relates to the field of semiconductor device processing, and more particularly, to the manufacture of semiconductor devices with raised source/drain structures.

BACKGROUND OF THE INVENTION

An exemplary conventional lightly doped drain transistor structure, such as that depicted in FIG. 1, suffers severe short channel effect for deep sub-micron device generation due to the trade-off and limitations of shallow junctions and low silicided source-drain resistance. Junction leakage is also a concern for silicided junctions. One approach to solve this problem is the use of raised source/drain regions to provide a transistor having ultra-shallow junctions. A raised source/drain region provides a necessary thickness so that contact metal will not short to the substrate. If a source/drain is made too deep into the substrate, it extends into the channel area, shortening the channel.

In the construction of raised source/drain transistors, it is important to control diffusion associated with dopants used to create the shallow junctions of the transistor. Typically, a first implant stage is performed prior to the deposition of the raised source/drain region in order to form an electrical connection underneath a thick sidewall spacing insulator, thereby coupling the moat to the channel region. However, the subsequent step of depositing the raised source/drain region may cause the previously disposed dopant to further diffuse to such an extent that the operating characteristics of the device are changed.

One approach to providing raised source/drain regions is to create such regions with the selective epitaxial ("selective epi") technique. See for example, U.S. Pat. No. 4,998,150. In this technique, epitaxial silicon is selectively deposited in the specified source/drain areas. However, selective epi growth in the source/drain areas is not considered to be a currently manufacturable process due to the loss of selectivity caused by defects on the field areas.

SUMMARY OF THE INVENTION

There is a need for a method of making a semiconductor device with raised source/drain structure, in a readily manufacturable process that is cost effective.

This and other needs are met by an embodiment of the present invention which provides a method of forming a semiconductor device with raised source and drain, comprising the steps of providing an etch stop layer on a gate of the semiconductor device, depositing a layer of semiconductor material over the semiconductor device, and etching the semiconductor layer to form spacers of a desired width and thickness. The etch stop layer protects the gate during the etching. The spacers are doped to create the raised source and drain. In certain embodiments, the semiconductor layer is made of amorphous silicon or polysilicon.

In alternative embodiments, the gate material is different from the spacer material such that the etch stop layer is not necessary. In these embodiments of the present invention, the two materials selected as the gate and the semiconductor material should have good selectivity.

Since the steps involved in forming the spacers comprise depositing of the semiconductor layer and etching, a simpler and more cost effective manner of forming the raised source/drain is provided, in comparison to the conventional selective epi deposition method. Also, there is a lower thermal budget required for the method of the present invention than for the selective epi deposition method of the prior art.

The earlier stated needs are also met by another embodiment of the present invention which provides a method of forming a semiconductor device with raised source and drain, comprising the steps of non-selectively depositing a layer of semiconductor material over the semiconductor device, etching the semiconductor layer to form spacers of a desired width and thickness, and doping the spacers to create the raised source and drain.

The earlier stated needs are also met by another embodiment which provides a semiconductor device having a raised source/drain, comprising a substrate with shallow junctions, a gate, and a raised source/drain formed of non-selectively deposited semiconductive material on the substrate. In this embodiment, since the raised source/drain is created without selective epitaxial growth, the benefits of a raised source/drain structure is provided without the loss of selectivity caused by defects on the field areas.

The foregoing and other features, aspects and advantages of the present invention will become more apparent from the following detailed description of the present invention when taken in conjunction with the accompanying drawings.

DETAILED DESCRIPTION OF ILLUSTRATIVE EMBODIMENTS

Figure 1:
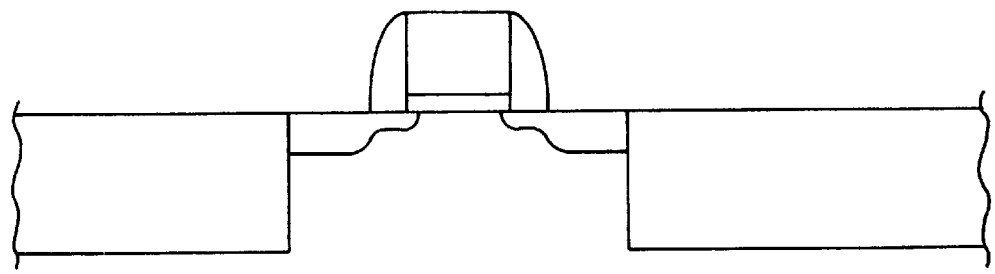
FIG. 1 is a cross-sectional view of a prior art transistor with a graded junction and shallow trench isolation.
Figure 2:
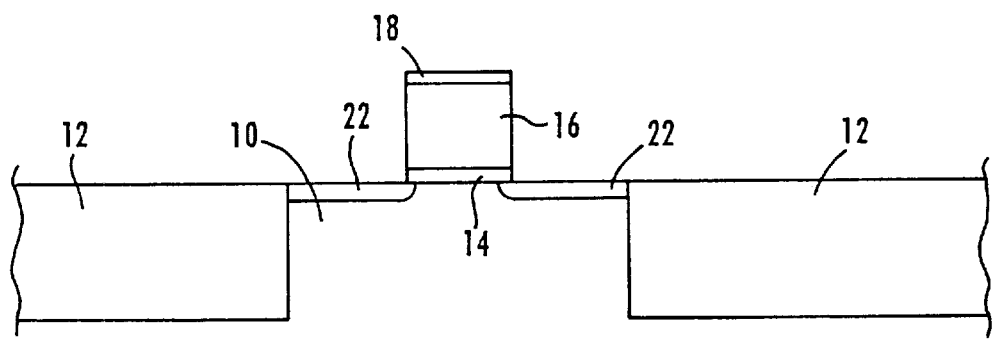
FIG. 2 is a cross-sectional view of a raised source/drain transistor of an embodiment of the present invention after a light direct implantation into the substrate.

FIG. 2 is a cross-sectional view of a transistor constructed in accordance with an embodiment of the present invention. The transistor has a substrate 10, and is isolated from other devices by shallow trench isolation regions 12. A gate oxide 14 is present on the substrate 10, this gate oxide 14 having been thermally grown, for example, in a previous step. A gate 16 (made of polysilicon, for example) is formed on the gate oxide, and an etch stop layer 18 is provided on the gate 16. The formation of the gate oxide layer, the gate layer and the etch stop layer is not depicted but is performed in a conventional manner in preferred embodiments. After formation of the layers, the gate 16 is masked and etched in a conventional manner to provide the structure depicted in FIG. 2. A light implantation is done directly into the substrate 10 to form doped areas 22.

The etch stop layer 18 may be any suitable etch stopping material, such as $Si_3N_4$, or $Al_2O_3$, for example. An etch stop layer 18 is provided over the gate 16 to protect the gate 16 during creation of silicon spacers in subsequent etching steps in the method of the present invention. In previous methods of creating raised source/drain transistors, an etch stop layer was not needed over the gate since a selective epi growth was employed to create the raised source/drain areas.

In certain other embodiments, the etch stop layer is not required. In these other embodiments, the material of the gate 16 and the spacer material have a good selectivity so that etching of the spacer material will not impact the gate to any significant extent. Those of ordinary skill in the art will select appropriate materials for the gate and the spacers to provide the good selectivity.

Figure 3:
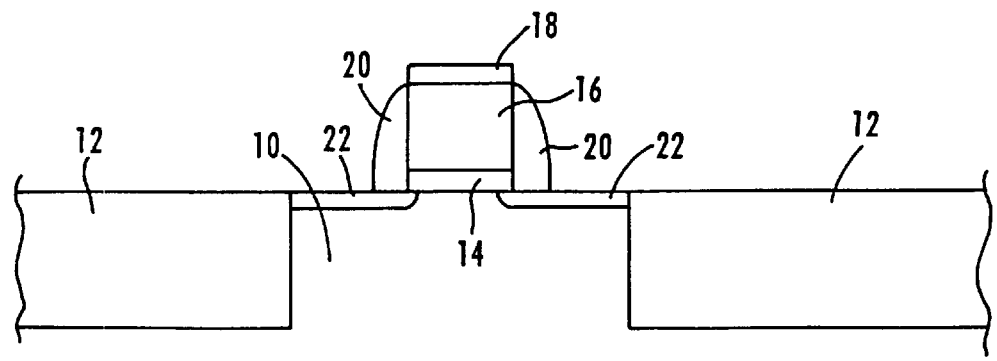
FIG. 3 is a cross-sectional view of the raised source/drain transistor of FIG. 2 after formation of dielectric sidewall spacers on the gate.

Sidewall spacers 20 are formed on the sides of the gate 16, as seen in FIG. 3. The sidewall spacers 20 are employed in the creation of the shallow junctions. The sidewall spacers 20 are composed of an oxide, in certain embodiments. The sidewall spacers 20 shadow the substrate 10 directly below during subsequent ion implantation steps. The thickness of the sidewall spacers 20 is set such that the dopants associated with the shallow junctions to be created by dopant diffusion from the raised source/drain into the substrate source/drain area move laterally. This movement should be far enough to provide an electrical connection between interim areas and the transistor channel region, while minimizing the depth of the shallow junctions. This aspect of the present invention is critical to control short channel effects in ultra-short channel transistors.

Figure 4:
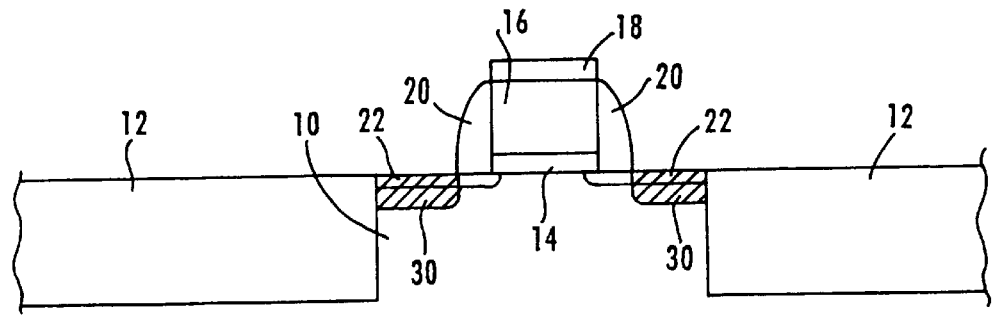
FIG. 4 is a cross-sectional view of the raised source/drain transistor of FIG. 3 after a first implantation, in accordance with an embodiment of the present invention.

FIG. 4 depicts the semiconductor device after an implantation step to form the ultra-shallow junctions, according to an embodiment of the present invention. The implantation is an LDD (lightly doped drain) type implantation, for example. The implantation dose energy for conventional LDD implantation can be increased to satisfy the necessary transistor performance, as is known to those of skill in the art. Either N-type material, such as arsenic, phosphorous or antimony, or P-type, such as boron or $BF_2$, is implanted in this step. As discussed earlier, however, this implantation step is performed before and/or after the sidewall spacers 20 are formed. An optional implant 30 can be performed before and/or after layer 24 is provided to improve the source/drain resistance. This implant 30 is only depicted in FIG. 4 for illustration purposes, and not FIGS. 5–8. However, it should be recognized that this implant 30 would carry through into the structures depicted in FIGS. 5–8 if the optional implantation step in FIG. 4 is performed.

Figure 5:
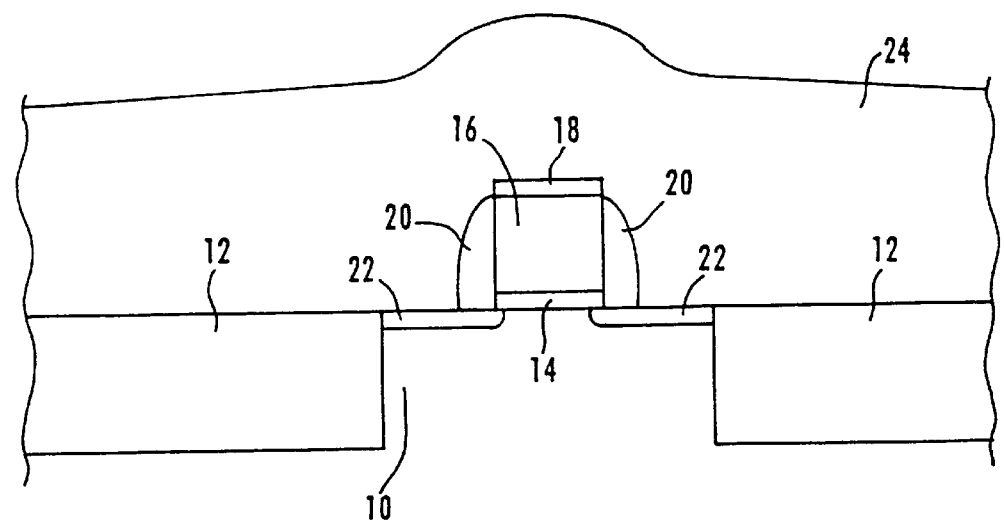
FIG. 5 is a cross-sectional view of the raised source/drain transistor of FIG. 4 after deposition of a spacer layer.

A layer 24 of semiconductive material, such as amorphous silicon, or polysilicon, is deposited over the gate 16, the etch stop layer 18, the sidewall spacers 20 and the substrate 10, as depicted in FIG. 5. This deposition is performed in a blanketing manner, in contrast to the selective epi deposition process. The deposition of the silicon according to the present invention is therefore simpler, and more cost effective, than the selective epi deposition process.

Figure 6:
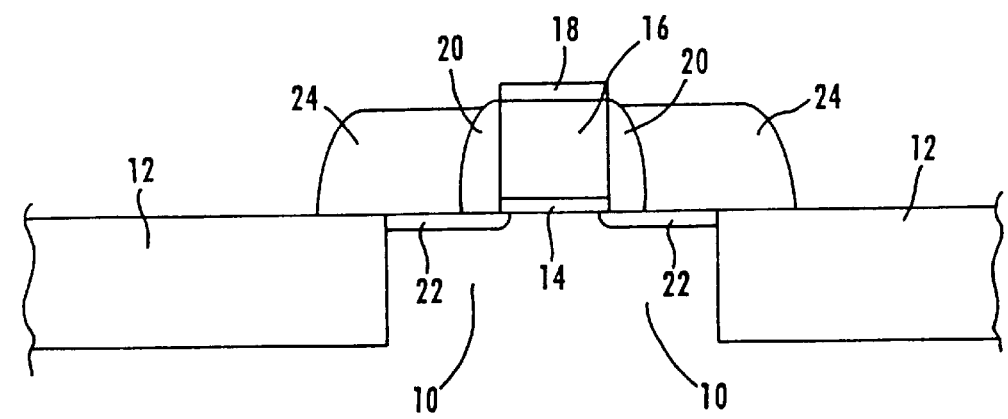
FIG. 6 is a cross-sectional view of the raised source/drain transistor of FIG. 5 after an initial etching to create silicon spacers.

Following the blanket deposition of the silicon layer 24 over the transistor, an initial etching back of the silicon layer 24 is performed to clear the field areas. The etching is either an isotropic etch, or an anisotropic etch, as provided in different embodiments of the present invention. In preferred embodiments, the etch is an anisotropic etch, such as reactive ion etch (RIE). The presence of the etch stop layer 18 over the gate 16 allows the etching of the silicon layer 24 to continue without risking etching into the gate 16. After the initial etching, the structure of the transistor is as depicted in FIG. 6.

Figure 7:
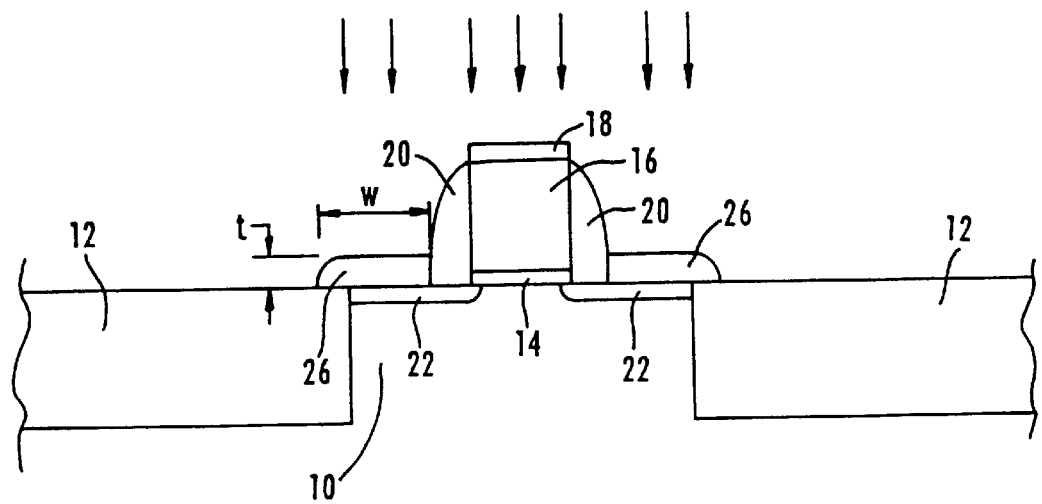
FIG. 7 is a cross-sectional view of the raised source/drain transistor of FIG. 6 following a further etching of the silicon spacers.

Subsequent to the initial etching back to clear the field area, the silicon is subjected to a further etching back to create silicon (or polysilicon) spacers 26, as depicted in FIG. 7. The etching is isotropic in certain embodiments, and anisotropic in other embodiments of the invention. By appropriate control of the thickness of the silicon layer 24 that was initially deposited, and the deposition/etch characteristics, as known to those of skill in the art, the size of the semiconductor spacers 26 is controlled. Hence, the semiconductor spacers 26 are formed with a desired width w and a desired thickness t. The thickness t should be such that adequately sized low-resistance silicide regions may be formed in the raised source/drain areas in subsequent processing steps, but the thickness primarily depends on the junction depth that is required. As is well known, the formation of silicide includes depositing a layer, such as a metal layer (e.g. titanium) over the transistor structure, and then reacting the same in a nitrogen ambient. The silicon from the raised source/drain regions (i.e., the semiconductor spacers 26) reacts with the titanium layer to form the metal silicide (e.g., titanium silicide) over the exposed surfaces of the semiconductor spacers 26. These subsequent processing steps are not depicted.

Prior to the formation of the low resistance silicide regions over the raised source/drain regions of the semiconductor spacers 26, a source/drain ion implantation into the raised semiconductor spacers 26 is performed to dope the semiconductor spacers 26. This step is indicated by the arrows in FIG. 7. In other embodiments, however, the source/drain ion implantation step is performed prior to the formation of the semiconductor spacers 26. Hence, the source/drain ion implantation step is performed either before and/or after the formation of the semiconductor spacers 26, in accordance with the different embodiments of the present invention.

Figure 8:
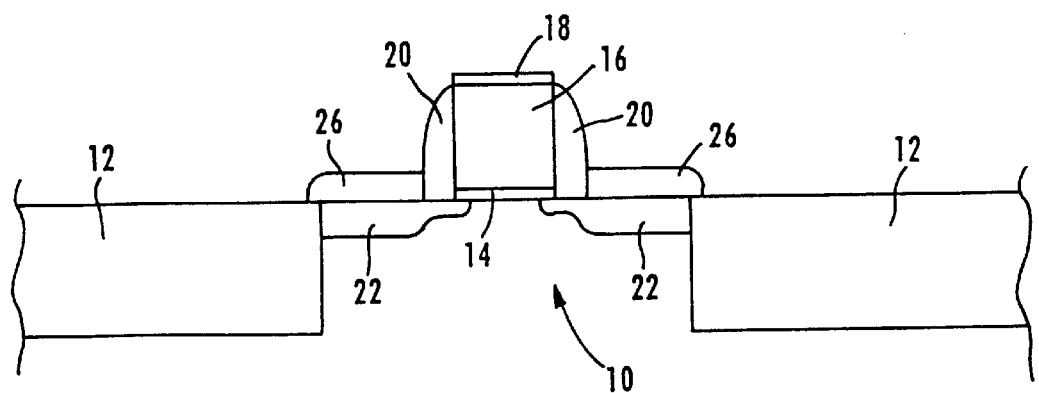
FIG. 8 is a cross-sectional view of the raised source/drain transistor of FIG. 7 following doping of the silicon spacers and solid state diffusion to create shallow junctions.

In the illustrated exemplary embodiment of the present invention, a conventional solid state diffusion process is employed to create the shallow junctions 28, following the doping of the semiconductor spacers 26. The final structure is as depicted in FIG. 8.

The present invention provides a semiconductor device, such as a transistor, with the advantages of a raised source/drain, but in a relatively simple and cost effective manner in comparison to the prior art. A lower thermal budget is required for the process according to the present invention than the selective epi growth method of creating raised source/drain regions in the prior art. Furthermore, the present invention allows the raised source/drain area to extend and overlap the field oxide region, which provides more area for contact metallization and therefore the active source/drain area can be reduced. This offers a borderless contact scheme to save the transistor size, and therefore the die size, due to the ability to accommodate a very tight design rule. The process of the present invention is readily performable with existing fabrication tools, so that new tools are not required.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of forming a semiconductor device with raised source and drain, comprising the steps of:

forming an etch stop layer directly on an upper surface of a gate conductor of the semiconductor device;

depositing a layer of semiconductor material over the semiconductor device including the etch stop layer and the gate conductor;

etching the semiconductor layer to form spacers of a desired width and thickness, the etch stop layer protecting the gate during the etching; and doping the spacers to create the raised source and drain, wherein the step of etching includes an initial etching back of the semiconductor layer to clear a field area, and further etching the semiconductor layer to a desired final thickness and width.

2. The method of claim 1, further comprising performing ion implantation to form shallow junctions in a substrate of the semiconductor device prior to the depositing of the layer of semiconductor material.

3. The method of claim 2, wherein the step of performing ion implantation includes the steps of performing lightly doped drain (LDD) ion implantation to form ultra-shallow junctions and performing source/drain ion implantation to form shallow junctions.

4. The method of claim 1, further comprising performing lightly doped drain (LDD) ion implantation, and performing source/drain ion implantation to form shallow junctions in a substrate of the semiconductor device.

5. The method of claim 4, further comprising performing solid state diffusion to create the shallow junctions after the spacers are formed, with the spacers serving as diffusion sources during the solid state diffusion.

6. The method of claim 2, wherein the step of etching includes anisotropic etching.

7. The method of claim 5, further comprising forming sidewall spacers of the gate after the step of performing LDD ion implantation.

8. The method of claim 5, further comprising forming sidewall spacers of the gate prior to the step of performing LDD ion implantation.

9. A method of forming a semiconductor device with raised source and drain, comprising the steps of:

forming an etch stop layer directly on an upper surface of a gate conductor formed on a semiconductor substrate;

forming first spacers on side walls of the gate conductor and not the etch stop layer;

non-selectively depositing a layer of semiconductor material over the semiconductor device including the etch stop layer, gate conductor, and first spacers;

etching the semiconductor layer to form second spacers of a desired width and thickness; and doping the second spacers to create the raised source and drain, wherein the step of etching includes an initial etching back of the semiconductor layer to clear a field area, and a further etching of the semiconductor layer to form the second spacers of a desired width and thickness.

10. The method of claim 9, further comprising performing ion implantation to form shallow junctions in a substrate of the semiconductor device prior to the depositing of the layer of semiconductor material.

11. The method of claim 10, wherein the step of performing ion implantation includes the steps of performing lightly doped drain (LDD) ion implantation to form ultra-shallow junctions and performing source/drain ion implantation to form shallow junctions.

12. The method of claim 9, further comprising performing lightly doped drain (LDD) ion implantation prior to the forming of the second spacers, and performing source/drain ion implantation after the forming of the second spacers to form shallow junctions in a substrate of the semiconductor device.

13. The method of claim 12, further comprising performing solid state diffusion to create the shallow junctions after the second spacers are formed, with the second spacers serving as diffusion sources during the solid state diffusion.

14. The method of claim 9, wherein the step of etching includes anisotropic etching.

15. A method of forming a semiconductor device with raised source and drain, comprising the sequential steps of:

forming an etch stop layer directly on only a gate conductor formed on a semiconductor substrate;

performing ion implantation to form shallow junctions in a substrate of the semiconductor device;

forming first spacers on side walls of the gate conductor, vertical surfaces of said first spacer not extending above an upper surface of said gate conductor;

performing an ion implantation into the semiconductor substrate using the first spacers as a mask;

non-selectively depositing a layer of semiconductor material over the semiconductor device;

performing a first etching of the semiconductor layer to clear a field area;

performing a second etching, different from the first etching, of the semiconductor layer to form second spacers of a desired width and thickness on the semiconductor substrate and the first spacers; and doping the second spacers to create the raised source and drain.

16. The method of claim 15, further comprising performing solid state diffusion to create the shallow junctions after the second spacers are formed, with the second spacers serving as diffusion sources during the solid state diffusion.

17. The method of claim 16, wherein the first and second etching includes anisotropic etching.

* * * * *